United States Patent
Kim

(10) Patent No.: US 9,065,030 B2
(45) Date of Patent: Jun. 23, 2015

(54) DIODE PACKAGE HAVING IMPROVED LEAD WIRE AND MANUFACTURING METHOD THEREOF

(75) Inventor: Jae Ku Kim, Seoul (KR)

(73) Assignee: GNE TECH CO., LTD., Seongnam-Si, Gyeonggi-Do (KR)

( * ) Notice: Subject to any disclaimer, the term of this patent is extended or adjusted under 35 U.S.C. 154(b) by 134 days.

(21) Appl. No.: 13/805,666

(22) PCT Filed: Mar. 23, 2011

(86) PCT No.: PCT/KR2011/001978
§ 371 (c)(1),
(2), (4) Date: Dec. 20, 2012

(87) PCT Pub. No.: WO2011/162470
PCT Pub. Date: Dec. 29, 2011

(65) Prior Publication Data
US 2013/0087826 A1    Apr. 11, 2013

(30) Foreign Application Priority Data

Jun. 21, 2010    (KR) .................. 10-2010-0058818

(51) Int. Cl.
*H01L 23/48*    (2006.01)
*H01L 33/62*    (2010.01)
(Continued)

(52) U.S. Cl.
CPC .............. *H01L 33/62* (2013.01); *H01L 24/34* (2013.01); *H01L 33/486* (2013.01); *H01L 33/647* (2013.01); *H01L 2924/01082* (2013.01); *H01L 2933/0033* (2013.01); *H01L 2933/0066* (2013.01); *H01L 2924/01033* (2013.01); *H01L 2924/01047* (2013.01); *H01L 2924/014* (2013.01); *H01L 33/005* (2013.01); *H01L 23/3107* (2013.01);

(Continued)

(58) Field of Classification Search
USPC ........ 257/690, 692, 694, 695, 735, 734, 666, 257/672, 673, 676, E33.01, E33.031, 257/E33.039, E33.042, E33.043, E33.048, 257/E33.052
See application file for complete search history.

(56) References Cited

U.S. PATENT DOCUMENTS 6,040,626 A * 3/2000 Cheah et al. ............... 257/735
6,249,041 B1 * 6/2001 Kasem et al. .............. 257/666
(Continued)

FOREIGN PATENT DOCUMENTS

JP    09-082865 A    3/1997
JP    09-219481 A    8/1997
JP    2003-347491 A    12/2003

OTHER PUBLICATIONS

International Search Report for PCT/KR2011/001978 mailed from ISA/KR on Dec. 26, 2011.

*Primary Examiner* — Timor Karimy
(74) *Attorney, Agent, or Firm* — Revolution IP, PLLC

(57) ABSTRACT

According to the present invention, there is provided a diode package in which a diode chip is sealed by a molding compound and a lead wire connected to the diode chip is led outside the molding compound, wherein the lead wire is divided into an upper lead wire and a lower lead wire, both lead wires each being formed in a long, flat plate and having a first stage and a second stage, both stages being opposite from each other, the upper side of the diode chip is attached to the lower side of the first stage of the upper lead wire, the lower side of the diode chip is attached to the upper side of the first stage of the lower lead wire, and the second stage of the upper lead wire and the second stage of the lower lead wire are led out in the lateral direction of the molding compound.

3 Claims, 5 Drawing Sheets

(51) Int. Cl.
- *H01L 23/00* (2006.01)
- *H01L 33/00* (2010.01)
- *H01L 23/495* (2006.01)
- *H01L 21/56* (2006.01)
- *H01L 33/48* (2010.01)
- *H01L 33/64* (2010.01)
- *H01L 23/31* (2006.01)

(52) U.S. Cl.
CPC ........ *H01L 23/49562* (2013.01); *H01L 21/561* (2013.01); *H01L 2924/1203* (2013.01); *H01L 24/97* (2013.01); *H01L 2224/97* (2013.01); *H01L 2224/37011* (2013.01); *H01L 2924/12041* (2013.01)

(56) References Cited

U.S. PATENT DOCUMENTS

| | | |
|---|---|---|
| 6,410,365 B1 * | 6/2002 | Kawata et al. ................ 438/123 |
| 2008/0224285 A1 | 9/2008 | Lim et al. |

\* cited by examiner

CUTTING LINE (a)

(b)

DIODE PACKAGE HAVING IMPROVED LEAD WIRE AND MANUFACTURING METHOD THEREOF

CROSS REFERENCE TO PRIOR APPLICATIONS

This application is a National Stage Application of PCT International Patent Application No. PCT/KR2011/001978, filed on Mar. 23, 2011, under 35 U.S.C. §371, which claims priority to Korean Patent Application No. 10-2010-0058818, filed on Jun. 21, 2010, which are all hereby incorporated by reference in their entirety.

FIELD OF THE INVENTION

The present invention relates to a diode package, and more particularly to a diode package which can be manufactured in a simple process and with improved heat radiation effect using an improved lead wire structure and manufacturing method thereof.

BACKGROUND OF THE INVENTION

As the degree of integration of electronic parts increases when they are mounted, a problem frequently occurs in that the reliability of the product falls or the life of each electronic device is shortened due to heat occurring from each electronic device mounted on a board. In particular, such deterioration is more noticeable in the case of a diode operating by a reverse bias such as a Zener diode or a light-emitting diode or a power diode that can handle a volume of current.

FIG. 1 is a drawing explaining a traditional diode package. As illustrated in FIG. 1, the traditional diode package is formed by welding both opposite sides of diode chip 10 to the ends of the lead wires 30 and 40, and by packaging the diode chip 10 and the lead wires 30 and 40 together with a molding compound 20. Reference numbers 30a and 40a denote welding points.

At this time, it is necessary that the two lead wires 30 and 40 are aligned and welded so that they are arranged in line. However, it is a very cumbersome task to perform the welding process in the state that they are aligned to be arranged in line and to package them with the molding compound 20 in the state that the lead wires 30 and 40 are welded and then they keep their shape.

Furthermore, since the lead wires 30 and 40 are formed with a thin wire, its heat radiation efficiency is not good. While the lead wires 30 and 40 should be thick in order to increase the heat radiation efficiency, the diode chip 10 should be enlarged in size since the lead wire welding portion 30a and 30b should be very thick. Accordingly, it is difficult to increase the heat radiation efficiency when the diode chip 10 is small in size.

As described above, in the traditional diode package, it is very cumbersome to manufacture it and there is limitation in increasing its heat radiation efficiency.

DETAILED DESCRIPTION OF THE INVENTION

Technical Problem

It is, therefore, an object of the present invention to provide a diode package and manufacturing method thereof, capable of not only manufacturing the diode package but also increasing heat radiation efficiency by improving structure of the lead wire.

Technical Solution

According to the present invention, there is provided a diode package in which a diode chip is sealed by a molding compound and a lead wire connected to the diode chip is led outside the molding compound, wherein the lead wire is divided into an upper lead wire and a lower lead wire, both lead wires each being formed in a long, flat plate and having a first stage and a second stage, both stages being opposite from each other, the upper side of the diode chip is attached to the lower side of the first stage of the upper lead wire, the lower side of the diode chip is attached to the lower side of the first stage of the upper lead wire, and the second stage of the upper lead wire and the second stage of the lower lead wire are led out in the lateral direction of the molding compound.

Preferably, the first stage of the upper lead wire has a hemispherical contact groove which protrudes downward, and the hemispherical contact groove has a through hole in the center thereof.

Preferably, the second stages of the upper lead wire and the lower lead wire have coupling holes formed therein, respectively.

There is provided a method for manufacturing a diode package to accomplish the above object, including preparing an upper lead frame which is formed by connecting a plurality of upper lead wires in parallel, the plurality of upper lead wires being formed by connecting the second stages of the upper lead wires side by side, and a lower lead frame which is formed by connecting a plurality of lower lead wires in parallel, the plurality of lower lead wires being formed by connecting the second stages of the lower lead wires side by side, and arranging the upper lead frame and the lower lead frame such that a diode chip is attached to the upper side of the first stage of the lower lead wire and the hemispherical contact groove of the upper lead wire is attached to the upper side of the diode chip; soldering the diode chip to the hemispherical contact groove of the upper lead wire through the through hole; making a package by molding the diode chip with a molding compound up and down; and trimming a connection portion of the second stage of the upper lead frame and the lower lead frame in order that parallel connection of the upper lead wire and the lower lead wire is released.

Technical Effects

According to the present invention, since the upper lead wire and the lower lead wire are formed in a flat shape, heat is radiated in the plate so that heat radiation efficiency increases compared with the case of the wire shape even though the thickness of the plate is thin. Furthermore, the upper lead frame and lower lead frame are arranged such that the upper lead wire and the lower lead wire are attached to the upper side and lower side of the diode chip and it is possible to package with the molding compound through a coupling process up and down once, thereby realizing a simple manufacturing process. Accordingly, production yield is enhanced and cost can be reduced. Furthermore, durability and reliability can be enhanced due to good heat radiation efficiency.

Since the diode package according to the present invention is thin and has high heat radiation efficiency, it is suitable for a smart diode used in smartphones, smart TVs and so on, which are popular recently, and for a bypass diode in a solar cell.

BRIEF DESCRIPTION OF THE DRAWINGS

The above and other objects and features of the present invention will become apparent from the following descriptions of embodiments given in conjunction with the accompanying drawings, in which.

DETAILED DESCRIPTION OF THE EMBODIMENTS

Hereinafter, preferred embodiments of the present invention will be described in detail with reference to the accompanying drawings. The embodiments below are suggested only to make the invention understood, and many variations can be made by those skilled in conventional knowledge without departing from the scope of the invention. Accordingly, it should not be construed that the scope of the present invention is restricted to such embodiments.

Figure 1:
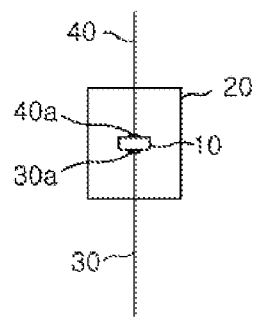
FIG. 1 is a drawing explaining a traditional diode package.
Figure 2:
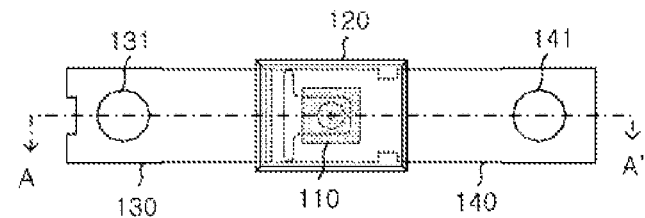
FIG. 2 is a plane view explaining a diode package according to the present invention.
Figure 3:
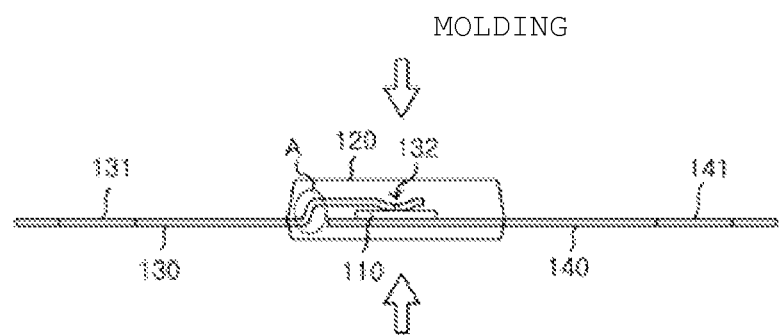
FIG. 3 is a sectional view cut along the line A-A' in FIG. 2.

FIG. 2 is a plane view explaining a diode package according to the present invention and FIG. 3 is a sectional view cut along the line A-A' in FIG. 2. Referring to FIGS. 2 and 3, lead wires 130 and 140 of the present invention are formed in a long flat plate shape differently from those formed in a wire shape, which is divided into an upper lead wire 130 and a lower lead wire 140.

The lower side of a first stage of the upper lead wire 130 is attached to an upper side of the diode chip 110 and there is formed a coupling hole 131 in the second stage. The upper side of the first stage of the lower lead wire 140 is attached to the lower side of the diode chip and there is formed a coupling hole 141 in the second stage. The diode chip 110 attached to the upper lead wire 130 and the lower lead wire 140 is packaged by a molding compound 120 to be sealed such that second stages of the upper lead wire 130 and the lower lead wire 140 are led out, respectively.

The upper lead wire has a bent portion in the molding compound, the bent portion being downward by about the thickness of diode chip 110, formed when the upper lead wire extends from the first stage to the second stage, such that the upper lead wire and the lower lead wire are led out in the opposite direction of each other and at the same height, in the molding compound 120.

Figure 4:
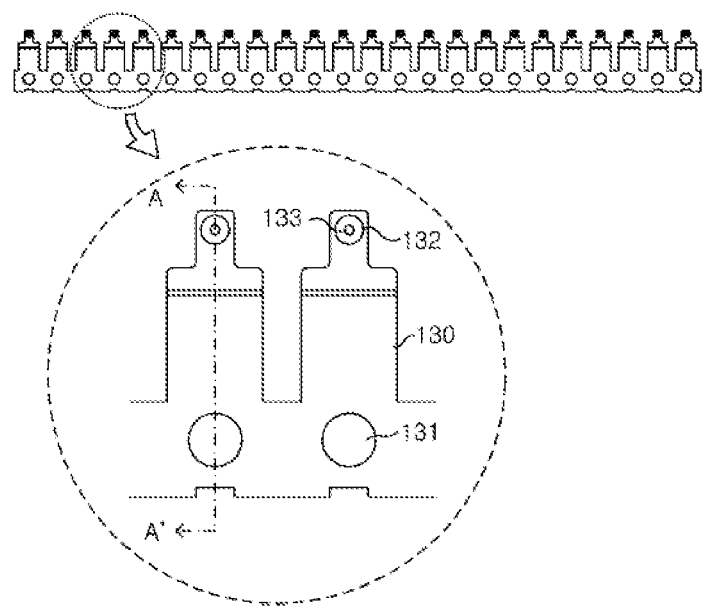
FIG. 4 is a plane view explaining an upper lead frame.
Figure 5:
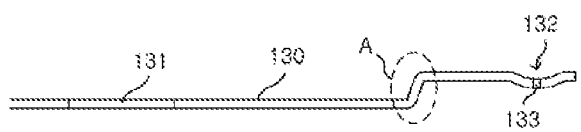
FIG. 5 is a sectional view cut along the line A-A' in FIG. 4.

FIG. 4 is a plane view explaining an upper lead frame and FIG. 5 is a sectional view cut along the line A-A' in FIG. 4. Referring to FIGS. 4 and 5, an upper lead frame is formed by connecting the second stage of the upper lead wire 130 side by side, that is, by connecting a plurality of upper lead wires in parallel.

The first stage of the upper lead wire 130 has a hemispherical contact groove 132 which protrudes downward, and the hemispherical contact groove 132 has a through hole 133 in the center thereof.

The upper lead wire 130 has a bent portion A which is bent downward while it goes from the first stage to the second stage. It is to make the upper lead wire 130 led out at the same height as the lower lead wire 140 when lead wire 130 is led out from the molding compound 120, since the hemispherical contact groove 132 of upper lead wire 130 is attached to the upper side of the diode chip 110. For this, the bent portion A of the lead wire 130 is formed to be appropriately detached from the hemispherical contact groove 132 such that the bent portion A is positioned in the molding compound 120.

Figure 6:
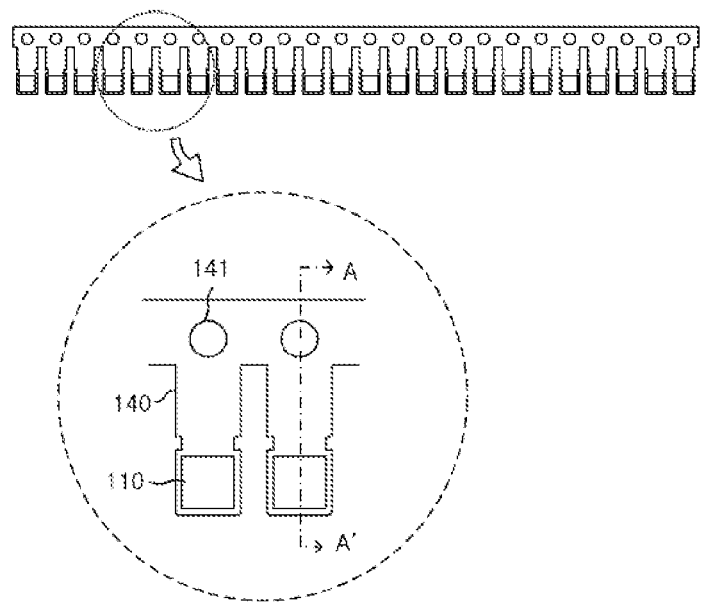
FIG. 6 is a plane view explaining a lower lead frame.
Figure 7:
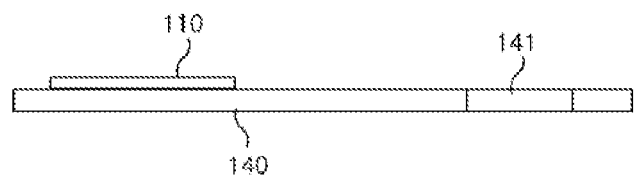
FIG. 7 is a sectional view cut along the line A-A' in FIG. 6.

FIG. 6 is a plane view explaining a lower lead frame and FIG. 7 is a sectional view cut along the line A-A' in FIG. 6. Referring to FIGS. 6 and 7, the lower lead frame is formed by connecting the second stage of the lower lead wire 140 side by side, that is, by connecting a plurality of lower lead wires in parallel. The diode chip 110 is mounted on the upper side of the second stage of the lower lead wire 140.

Since the upper lead wire 130 is bent downward, the lower lead wire 140 has a flat shape without having to be bent upward. If the upper lead wire 130 has a flat shape, then the lower lead wire 140 has to be bent upward while it goes from the first stage to the second stage.

Figure 8:
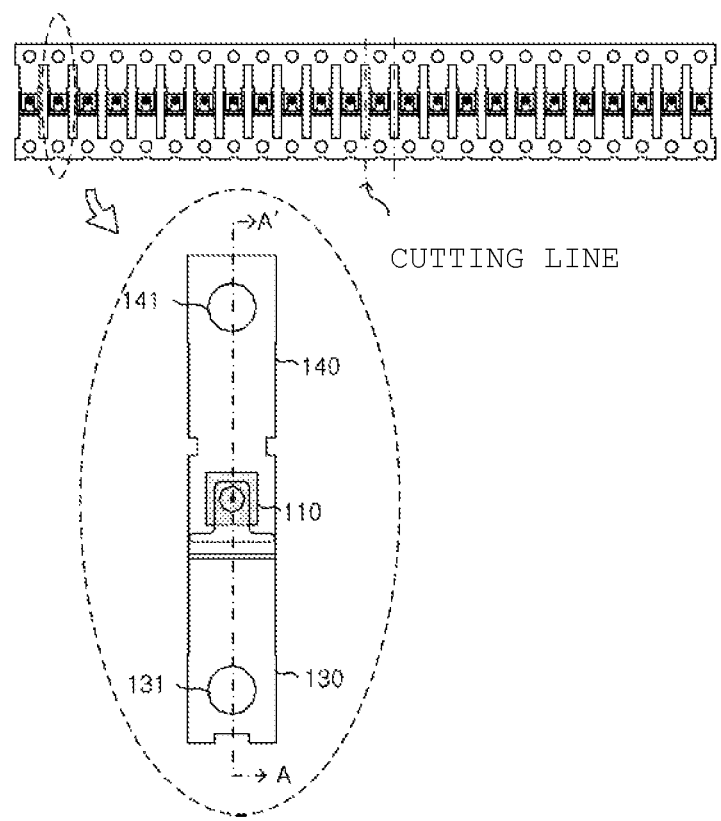
FIG. 8 is a plane view explaining an assembly procedure of an upper lead frame in FIG. 4 and a lower lead frame in FIG. 5.
Figure 9:
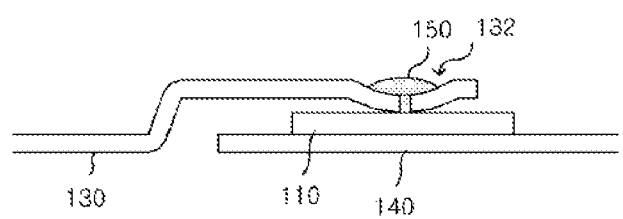
FIG. 9 is a sectional view cut along the lien A-A' in FIG. 8.

FIG. 8 is a plane view explaining an assembly procedure of an upper lead frame in FIG. 4 and a lower lead frame in FIG. 5, and FIG. 9 is a sectional view cut along the line A-A' in FIG. 8. Referring to FIGS. 8 and 9, the upper lead wire 130 and the lower lead wire 140 are arranged to correspond to one another by contacting the hemispherical contact groove 132 of the upper lead wire 130 with the upper side of the diode chip 110 in the state that the diode chip 110 is mounted on the first stage of the lower lead wire 140. At this time, the second stage of the upper lead wire 130 and the second stage of the lower lead wire 140 are positioned to be opposite from each other so that the upper lead wire 130 and the lower lead wire 140 are arranged in line.

In this state, soldering is performed to attach the lead wire 130 to the diode chip 110 at the entrance of a dented portion. Then, soldering is performed through the through hole 133. Since the entrance of the dented portion of the hemispherical contact groove 132 is large although the through hole 133 is small in size, the process latitude is great when performing the soldering so that the soldering process can be conveniently performed. Of course, a coupling process of the lower lead wire 140 and the diode chip 110 is performed before and after installing the upper lead wire 130.

As such, when the upper lead wire 130 and the lower lead wire 140 are coupled with each other, since the lower lead wire 140 supports the diode chip 110 from below, the shape of the resultant product remains different than the conventional case even though the diode chip 110 floats in the space. At this time, if the diode chip is simultaneously coupled with the molding compound 120 up and down, the packaging is performed with the molding compound 120 by only one coupling process. After that, with cutting along the cutting line in FIG. 8, the diode package according to the present invention is obtained as illustrated in FIG. 3. While a packaging is performed by the molding compound 120 individually after cutting along the cutting line, the former case is more preferable for mass production.

Figure 10:
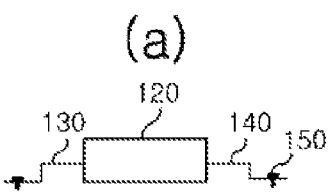
FIG. 10 is a drawing explaining an installation example of a diode package according to the present invention.
Figure 10:
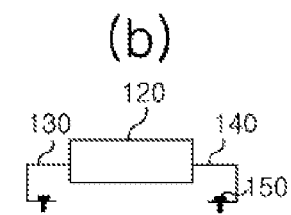

FIG. 10 is a drawing explaining an installation example of a diode package according to the present invention. Referring to FIG. 10, even though the lower lead wire 140 becomes large in width in order to increase the heat radiation efficiency, its thickness does not increase so that it is easy to bend the lead wires up and down. Therefore, it is possible to appropriately bend the upper lead wire 130 and the lower lead wire 140 depending on its circumstances and then to mount them on a board using a clamping means in a variety of forms.

As described above, according to the present invention, since the upper lead wire 130 and the lower lead wire 140 are formed in a flat plate, it heats in the plate so that its heat radiation efficiency increases compared with the wire shape even though they are thin. Furthermore, since it is possible to package the diode chip 110 with the molding compound 120 by performing the coupling process once only after the upper lead frame and the lower lead frame are arranged in order that the upper lead wire 130 and the lower lead wire 140 are attached to the upper and lower sides of the diode chip 110, respectively, the manufacturing process becomes simple. Accordingly, it is possible to reduce costs since production yield is enhanced, and durability and reliability of product become enhanced since the heat radiation efficiency is improved.

Since the diode package according to the present invention is thin and has high heat radiation efficiency, it is suitable as a smart diode used in smartphones, smart TVs and so on, which are popular trends recently, and for a bypass diode in a solar cell.

While the invention has been shown and described with respect to the preferred embodiments, the present invention is not limited thereto. It will be understood by those skilled in the conventional knowledge that various changes and modifications may be made without departing from the scope of the invention as defined in the following claims.

What is claimed is:

1. A diode package, comprising:
   a diode chip;
   a molding compound, wherein said diode chip is sealed by said molding compound;
   a lead wire connected to the diode chip, said lead wire being led outside the molding compound,
   wherein the lead wire is divided into an upper lead wire and a lower lead wire, each of the upper and lower lead wires being formed in a long and flat plate and having a first stage and a second stage, both stages being opposite from each other, an upper side of the diode chip is attached to a lower side of the first stage of the upper lead wire, a lower side of the diode chip is attached to an upper side of the first stage of the lower lead wire, and the second stage of the upper lead wire and the second stage of the lower lead wire are led out in the lateral direction of the molding compound,
   wherein the first stage of the upper lead wire has a hemispherical contact groove which protrudes downward, and the hemispherical contact groove has a through hole in the center thereof.

2. The diode package of claim 1, wherein the second stages of the upper lead wire and the lower lead wire have coupling holes formed therein, respectively.

3. The diode package of claim 1, wherein the upper lead wire has a bent portion in the molding compound, the bent portion being downwardly formed when the upper lead wire extends from the first stage to the second stage, such that the second stages of the upper lead wire and the lower lead wire are led out in the opposite direction from each other at the same height.

* * * * *